(12) United States Patent
Abe et al.

(10) Patent No.: US 6,615,715 B2
(45) Date of Patent: Sep. 9, 2003

(54) SCREEN PRINTING APPARATUS, SCREEN PRINTING METHOD, AND PASTE STORAGE CONTAINER FOR SCREEN PRINTING APPARATUS

(75) Inventors: Seikoh Abe, Fukuoka (JP); Michinori Tomomatsu, Fukuoka (JP); Seiichi Miyahara, Fukuoka (JP); Kimiyuki Yamasaki, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/898,243

(22) Filed: Jul. 3, 2001

(65) Prior Publication Data

US 2002/0053292 A1 May 9, 2002

(30) Foreign Application Priority Data

Jul. 11, 2000 (JP) ........................................ 2000-209419

(51) Int. Cl.⁷ .......................... B05D 1/36; B05C 17/005; B41L 13/18
(52) U.S. Cl. ....................... 101/129; 101/123; 427/282; 427/96; 118/406; 222/330
(58) Field of Search ................................ 101/119, 120, 101/123, 124, 129; 427/96, 272, 282, 376.2; 118/406; 222/330

(56) References Cited

U.S. PATENT DOCUMENTS

| | | | | |
|---|---|---|---|---|
| 4,961,955 A | * | 10/1990 | Goldberg | 427/560 |
| 6,158,338 A | * | 12/2000 | MacRaild et al. | 101/123 |
| 6,495,199 B1 | * | 12/2002 | Kaiser et al. | 427/96 |
| 2001/0023645 A1 | * | 9/2001 | Miyahara et al. | 101/123 |
| 2002/0088354 A1 | * | 7/2002 | Miyahara et al. | 101/123 |

FOREIGN PATENT DOCUMENTS

GB        2 334479 A    *    8/1999

* cited by examiner

Primary Examiner—Leslie J. Evanisko
(74) Attorney, Agent, or Firm—RatnerPrestia (57) ABSTRACT

A squeegee head having a volume-variable container and a printing space is used. The volume-variable container is variable in capacity with pressures applied thereto. The volume-variable container includes a projecting portion having a plurality of projections, a push-plate with a plurality of through-holes formed therein, and a side wall. A paste is stored in the volume-variable container. The projecting portion is pressurized to move and the paste is pushed out into the printing space from the through-holes, and then, the projections are fitted into the through-holes. In this way, the paste being stable in viscosity is completely pushed out into the printing space without wasting at all.

17 Claims, 5 Drawing Sheets

SCREEN PRINTING APPARATUS, SCREEN PRINTING METHOD, AND PASTE STORAGE CONTAINER FOR SCREEN PRINTING APPARATUS

FIELD OF THE INVENTION

The present invention relates to a screen printing apparatus, screen printing method, and paste storage container used for the screen printing apparatus. More particularly, it relates to a screen printing method to print cream solder or conductive paste on a substrate or the like, and a paste storage container used for a screen printing apparatus.

BACKGROUND OF THE INVENTION

In a conventional electronic parts mounting process, a screen printing has been employed as a method to print cream paste, conductive paste or like paste on a substrate. Such conventional screen printing method comprises a step of setting a mask plate on a substrate wherein the mask plate has pattern holes formed according to the printing portions, and a step of printing a paste on the substrate through the pattern holes in the mask plate by squeezing.

As a squeezing method in such conventional screen printing, a method of using a closed-type squeegee head is well-known. In this method, unlike an ordinary screen printing method, the paste is not directly supplied onto the mask plate, but a squeegee head which stores the paste is installed in the printing apparatus. In such method of using a closed-type squeegee head, unlike a conventional printing method in which the paste is directly supplied onto the screen mask, the paste is supplied in a state of being stored in a storage container such as a cartridge in the squeegee head. And, the paste in the cartridge is pressurized and pushed out. The squeegee head slides on the mask plate while being in contact with the mask plate, and thereby, the paste is filled into each pattern hole sequentially. In the conventional method, a container having an opening to push out the paste at the bottom is used as a cartridge. Inside the container, a pressure plate disposed free to move up and down is pressed, then the paste is gradually pushed out of the opening at the bottom.

However, the paste storing cartridge used for the conventional closed-type squeegee head has problems as described in the following.

Generally, a paste like cream solder is adhesive and hard to flow, and furthers has a characteristic such that the cream solder changes in property with the lapse of time. Accordingly, it has been difficult to push out the paste from the opening smoothly at a specified pressure by utilizing the change in fluidity of the paste when the pressure plate is pressed by the specified pressure.

Also, using the conventional storage container, it is difficult to completely push out and use up the paste. Accordingly, there has been generated much paste unused and discarded, resulting in wasting the material.

The present invention is intended to provide a screen printing apparatus, screen printing method, and paste storage container for the screen printing apparatus, by which the paste can be reliably pushed out and completely used at all times without wasting the material.

SUMMARY OF THE INVENTION

A screen printing apparatus to print a paste on a substrate of the present invention comprises:

(a) a positioning section which holds the substrate;

(b) a mask plate having pattern holes, where the mask plate is disposed above the substrate;

(c) a squeegee head to store and supply the paste onto the mask plate; and (d) a pressure mechanism to pressurize the paste in the squeegee head, wherein the squeegee head includes a paste storage container to store the paste and a printing space to accommodate the paste supplied from the paste storage container;

the paste storage container has a volume-variable container which varies in volume according to the operation of the pressure mechanism;

the volume-variable container has through-holes; and the volume-variable container is reduced in volume according to the operation of the pressure mechanism, and the paste filled in the volume-variable container is pushed out into the printing space through the through-holes, and thereby, the paste is supplied onto the mask plate.

A screen printing method of the present invention comprises:

(a) a step of preparing a squeegee head having a volume-variable container and a printing space, where the volume-variable container includes a projecting portion with projections, side wall, and push-out plate with through-holes, and the printing space is communicated to the push-out plate;

(b) a step of storing a paste in the volume-variable container;

(c) a step of pressurizing the projecting portion and also pushing out the paste into the printing space through the through-holes while compressing the interior of the volume-variable container;

(d) a step of continuously pressurizing the projecting portion so that the projections fit into the through-holes, thereby pushing out the paste remaining in the through-holes into the printing space; and (e) a step of supplying the paste pushed out into the printing space onto the mask plate to print the paste on a substrate via the mask plate.

Preferably, the volume-variable container includes a push-out plate which forms the bottom of the volume-variable container, and the push-out plate has a plurality of through-holes, and the paste is pushed out into the printing space through the through-holes.

Preferably, the volume-variable container further includes a free-to-move projecting portion, and the projecting portion has a plurality of projections which may fit into the through-holes, and according to the operation of the pressure mechanism, the projecting portion moves to push out the paste in the volume-variable container into the printing space through the through-holes, and then the projections fit into the through-holes to push out the paste remaining in the through-holes into the printing space.

By the above configuration, the paste being stable in viscosity is pushed out into the printing space. Further, the paste stored in the paste storage container can be completely pushed out into the printing space without remaining in the paste storage container.

BRIEF DESCRIPTION OF THE DRAWINGS

FIGS. 4(a) and (b) are sectional views of a cartridge having cream solder used in a screen printing apparatus in one embodiment of the present invention.

FIGS. 5(a) and (b) are sectional views of a cartridge having cream solder used in a screen printing apparatus in one embodiment of the[ ]present invention.

DETAILED DESCRIPTION OF THE INVENTION

A screen printing apparatus to print a paste on a substrate in one embodiment of the present invention comprises:

(a) a positioning section which holds the substrate;

(b) a mask plate having pattern holes, disposed above the substrate;

(c) a squeegee head to store the paste and supply the paste onto the mask plate; and (d) a pressure mechanism to pressurize the paste in the squeegee head, wherein the squeegee head includes a paste storage container to store the paste, and a printing space accommodate the paste supplied from the paste storage container;

the paste storage container has a volume-variable container which varies in volume according to the operation of the pressure mechanism;

the volume-variable container has through-holes; and the volume-variable container is reduced in volume according to the operation of the pressure mechanism, and the paste filled in the volume-variable container is pushed out into the printing space through the through-holes, and thereby, the paste is supplied onto the mask plate.

A screen printing method in one embodiment of the present invention comprises:

(a) a step of preparing a squeegee head having a volume-variable container and a printing space, where the volume-variable container includes a projecting portion with projections, side wall, and push-out plate with through-holes, and the printing space is communicated to the push-out plate;

(b) a step of storing a paste in the volume-variable container;

(c) a step of pressurizing the projecting portion and also pushing out the paste into the printing space through the through-holes while compressing the interior of the volume-variable container;

(d) a step of continuously pressurizing the projecting portion so that the projections fit into the through-holes, thereby pushing out the paste remaining in the through-holes into the printing space; and (e) a step of supplying the paste pushed out into the printing space onto the mask plate to print the paste on a substrate via the mask plate.

A paste storage container used in the screen printing apparatus of the present invention to print a paste on a substrate comprises:

a projecting portion;

a push-out plate disposed in a position opposing to the projecting portion; and a side wall arranged between the projecting portion and the push-out plate, wherein a volume-variable container is formed by the projecting portion, the push-out plate, and the side wall;

the paste is stored in the volume-variable container;

the projecting portion has projections;

the push-out plate has through-holes;

the projecting portion is able to move toward the push-out plate, and when the projecting portion moves toward the push-out plate, the projections may thrust into the through-holes; and when the projecting portion moves toward the push-out plate, the paste stored in the volume-variable container is pushed out through the through-holes, and the projections are thrust into the through-holes.

Preferably, the volume-variable container includes a push-out plate which forms the bottom of the volume-variable container, and the push-out plate has a plurality of through-holes, and the paste is pushed out into the printing space through the through-holes.

Preferably, the through-holes are shaped so that the paste decreases in viscosity while passing through the through-holes.

Preferably, the volume-variable container further includes a free-to-move projecting portion, and the projecting portion has a plurality of projections which may fit into the through-holes, and according to the operation of the pressure mechanism, the projecting portion moves to push out the paste in the volume-variable container into the printing space through the through-holes, and then the projections fit into the through-holes to push out the paste remaining in the through-holes into the printing space.

Preferably, the screen printing apparatus further comprises a main body to retain the paste storage container, and the paste storage container is removably disposed in the main body.

Preferably, the pressure mechanism includes a pressure plate, and the pressure plate is abutted on top of the projecting portion.

Preferably, the squeegee head has two sheets of scraping portions, and the printing space is surrounded by the push-out plate and the two scraping portions, and the two scraping portions are arranged in a manner such that the printing space is internally sloped so as to be downwardly reduced in sectional area, thus forming an opening at the bottom.

Preferably, the volume-variable container further includes a side wall member that forms the side wall of the volume-variable container, and the side wall member is flexible, and the projecting portion moves downward while compressing the side wall member.

Preferably, the volume-variable container further includes an elastic bag member having an opening;

the push-out plate is located at the opening;

the elastic bag member is flexible; and with the paste filled into the elastic bag member, when the projecting portion moves downward while compressing the elastic bag member, the paste in the elastic bag member is pushed out into the printing space through the through-holes, and then the projections fit into the through-holes via the elastic bag member.

Preferably, the squeegee head is disposed in a manner such that the squeegee head moves to slide on the mask plate.

Preferably, the paste is cream solder.

By the above configuration, the paste being stable in viscosity is pushed out into the printing space. Further, the paste stored in the paste storage container can be completely pushed out into the printing space without remaining in the paste storage container.

Exemplary Embodiment

An exemplary embodiment of the present invention will be described in the following with reference to the drawings.

Figure 1:
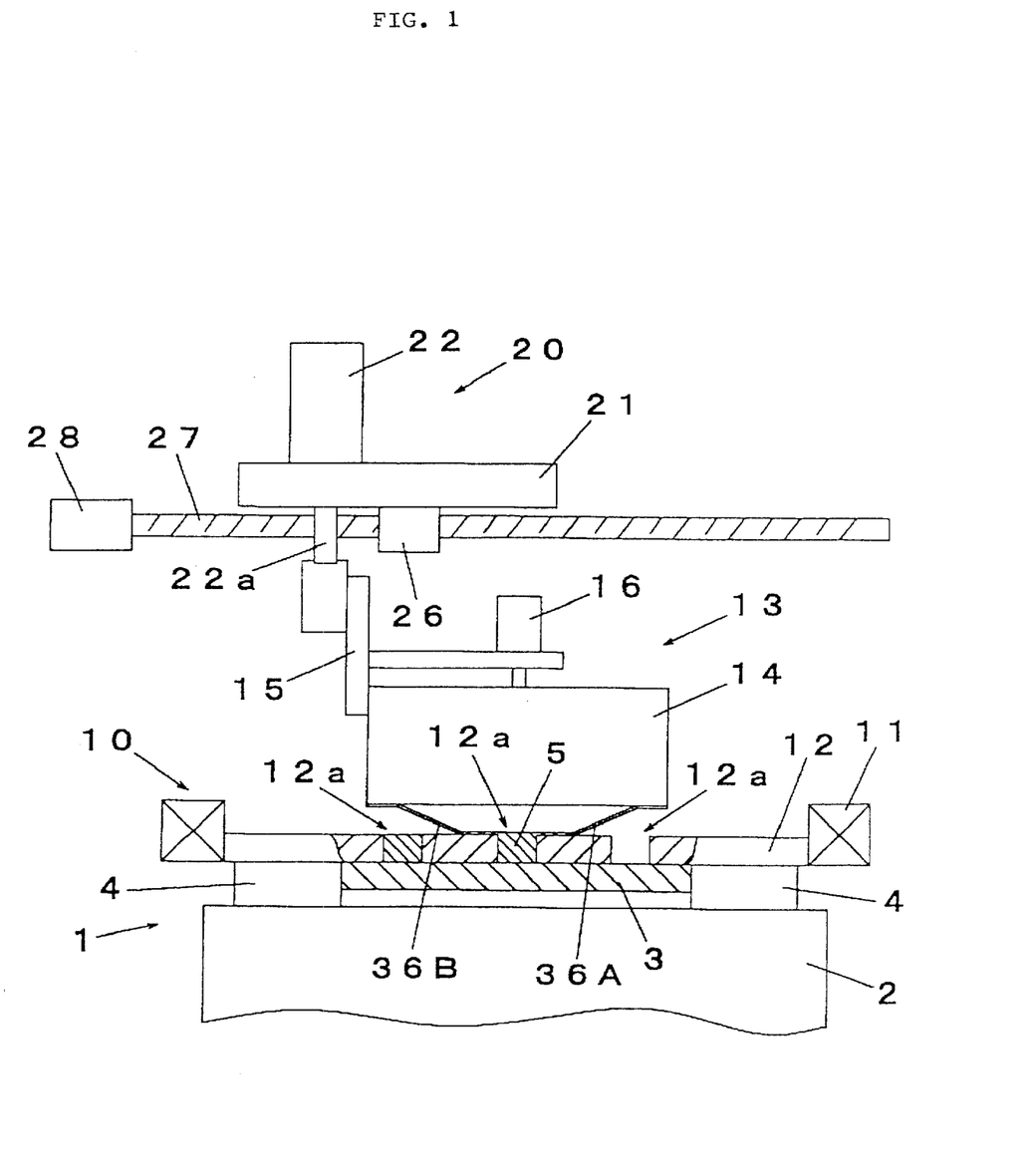
FIG. 1 is a front view of a screen printing apparatus in one embodiment of the present invention.

FIG. 1 is a front view of a screen printing apparatus in one embodiment of the present invention.

Figure 2:
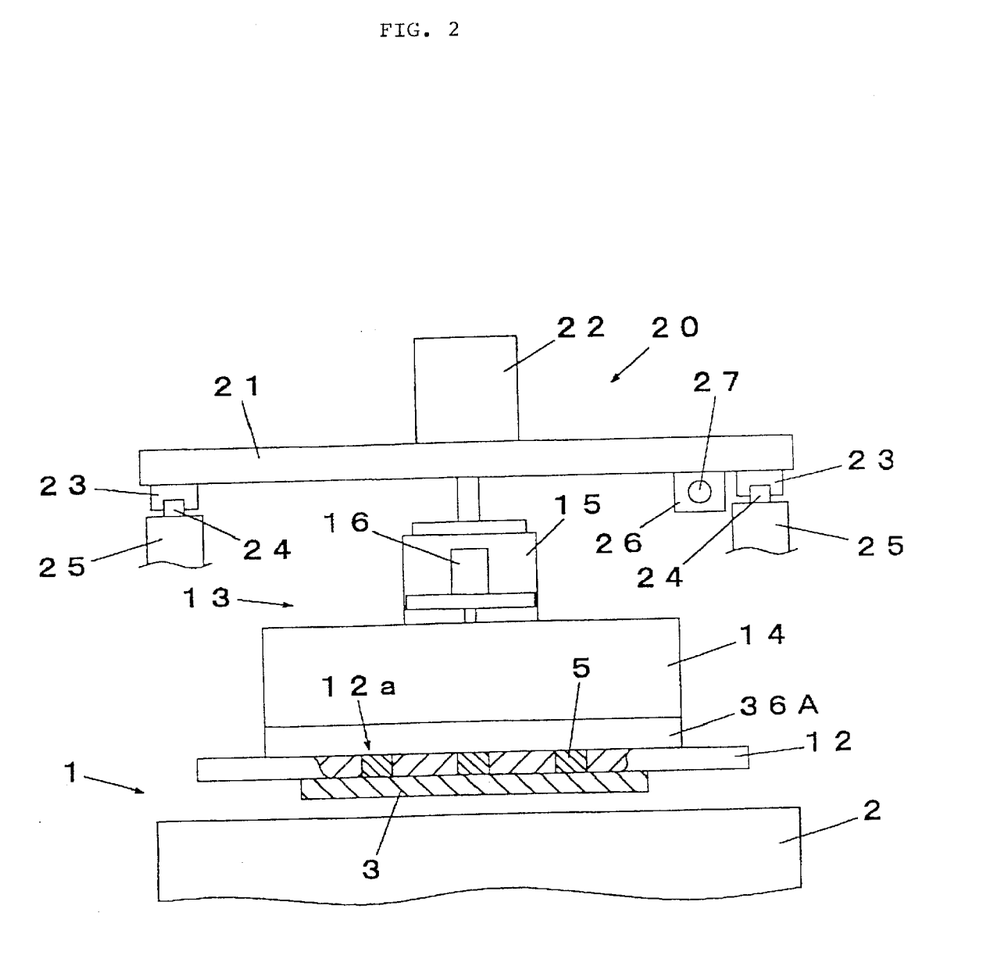
FIG. 2 is a side view of a screen printing apparatus in one embodiment of the present invention.

FIG. 2 is a side view of a screen printing apparatus in one embodiment of the present invention.

Figure 3:
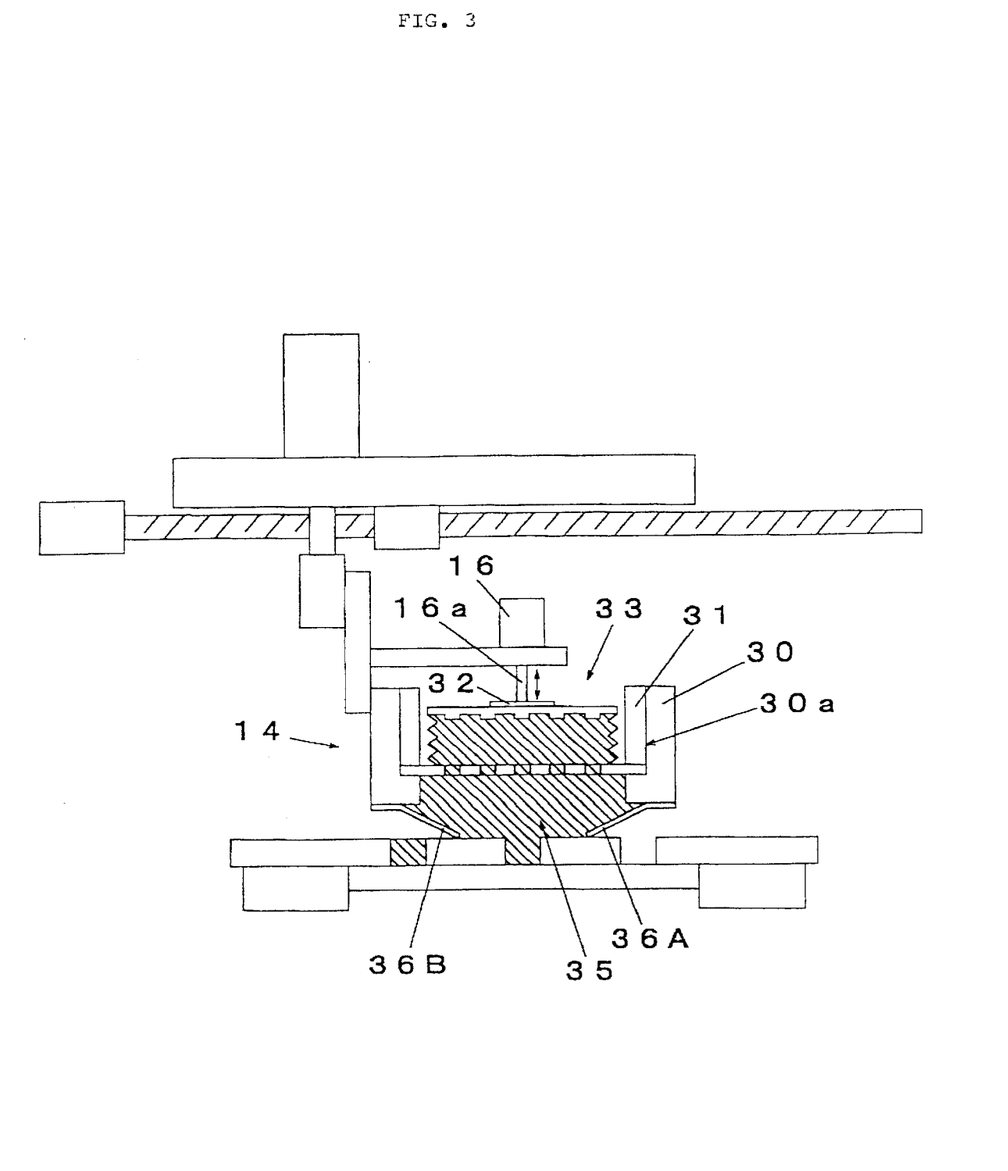
FIG. 3 is a partly sectional view of a squeegee head of a screen printing apparatus in one embodiment of the present invention.

FIG. 3 is a partly sectional view of a squeegee head of a screen printing apparatus in one embodiment of the present invention.

Figure 4:
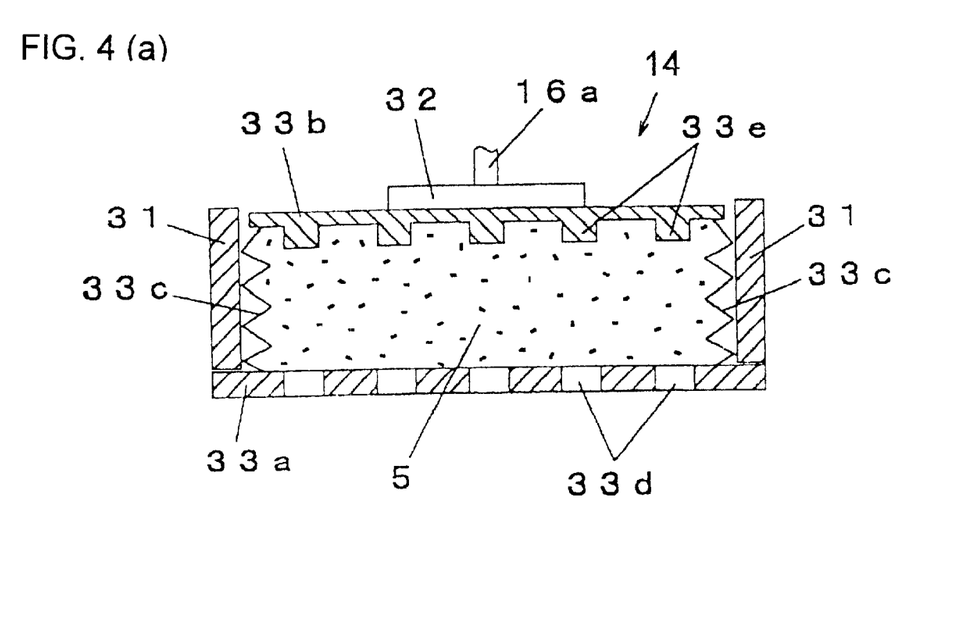

FIG. 4 is a sectional view of a cartridge having cream solder used in a screen printing apparatus in one embodiment of the present invention.

Figure 5:
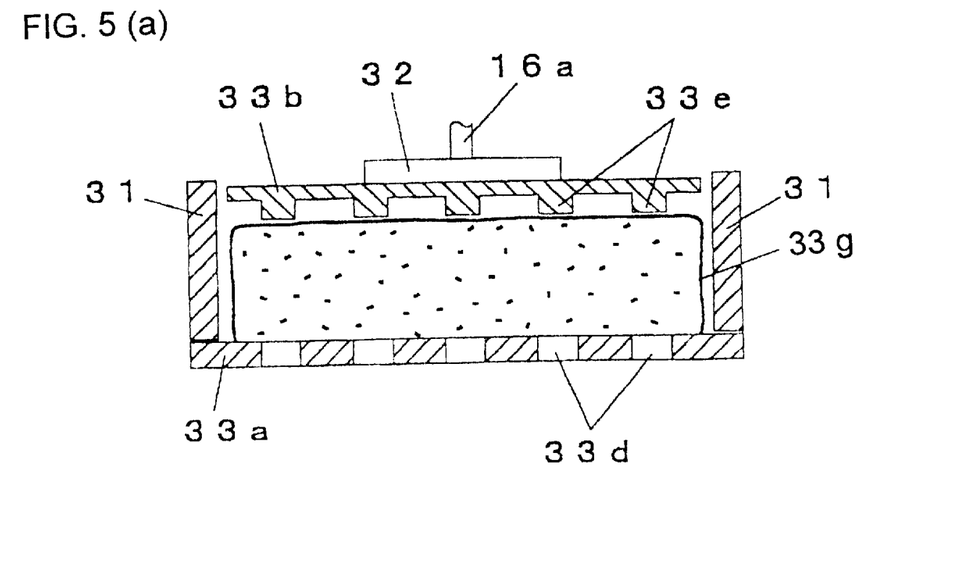

FIG. 5 is a sectional view of a cartridge having cream solder used in a screen printing apparatus in another embodiment of the present invention.

First, the structure of the screen printing apparatus will be described with reference to FIG. 1 and FIG. 2.

In FIG. 1 and FIG. 2, substrate positioning portion 1 comprises a substrate holding section 2 and a damper 4. The substrate holding portion 2 is installed on a moving table (not shown). Substrate 3 subjected to screen printing is held on the substrate holding portion 2 by the damper 4 of the substrate holding portion 2. When the moving table (not shown) is driven, the substrate 3 held on the substrate holding portion 2 moves horizontally and vertically to be positioned.

Screen mask 10 is disposed above the positioning section 1. The screen mask 10 includes a holder 11 and a mask plate 12 retained by the holder 11. The mask plate 12 has pattern hole 12a formed in a position corresponding to the printing portion of substrate 3 to be printed. Preferably, the pattern hole 12a has a plurality of pattern holes.

Squeegee head 13 is disposed above the screen mask 10, and the squeegee head can be freely moved up and down by head up-down moving section 20. The head up-down moving section 20 comprises a cylinder 22 disposed on a plate member 21. The squeegee head 13 is connected to the bottom end of rod 22a of the cylinder 22 via connecting member 15. When the cylinder 22 is driven, the squeegee head 13 moves up and down against the mask plate 12, and the squeegee head 13 is pressed against the mask plate 12. The head up-down moving section 20 functions as a lifting and lowering mechanism to move the squeegee head 13 up and down against the screen mask 10. The cylinder 22 functions as a pressure mechanism to press the squeegee head 13 against the mask plate 12.

Slider 23 is fixed to either end portion on the underside of plate member 21 of the head up-down moving section 20. The slider 23 is slidably engaged in guide rail 24 disposed on top of frame 25. Nut 26 is connected to the underside of the plate member 21. Feed screw 27 threaded onto the nut 26 is rotationally driven by motor 28.

When the motor 28 is operated, the plate member 21 is horizontally moved, and accordingly, the squeegee head 13 connected to the head up-down moving section 20 is also moved horizontally. Since the motor 28 is operated with the squeegee head 13 lowered, the squeegee head 13 is horizontally moved on the mask plate 12. That is, each of the motor 28, feed screw 27, and nut 26 has a function as a moving member to move the squeegee head 13 horizontally on the mask plate 12.

Volume-variable container 14 is arranged under the squeegee head 13. The capacity of the volume-variable container 14 varies in accordance with the operation of the pressure mechanism. Cream solder 5 is filled in the volume-variable container 14. When the underside of the squeegee head 13 slides on the surface of the mask plate 12, the cream solder 5 is pushed out and filled into pattern hole 12a. The cream solder is a paste.

The volume-variable container 14 is here described with reference to FIG. 3. In FIG. 3, main body 30 is a block member which is rectangular in the widthwise direction of the mask plate 12. The main body 30, as shown in FIG. 2, has a length that may cover the width of substrate 3 subjected to printing.

The cream solder 5 is stored in the volume-variable container 14. Cartridge 33 is detachably installed in the main body 30. The main body 30 has a concavity 30a for detachable installation of the cartridge 33. The cartridge 33 has a function as a paste storage container to store the predetermined amount of cream solder 5. The cartridge 33 is installed in the concavity 30a via retaining frame member 31.

As shown in FIG. 4 (a), the volume-variable container 14 of cartridge 33 comprises a bottom 33a, a top 33b and a side portion 33c. The bottom 33a is a push-out plate 33a. The top 33b is a plate-form projecting portion 33b. Side portion 33c is a bellows-type membrane member 33c. The bellows-type membrane member 33c is vertically flexible. The plate-form projecting portion 33b and the push-out plate 33a are connected by the bellows-type membrane member 33c.

The push-out plate 33a has a plurality of through-holes 33d arranged therein, and the cream solder 5 is pushed out from the through-holes 33d. The plurality of through-holes 33d are formed in size and shape such that the cream solder passing through the through-holes are decreased in viscosity. Preferably, the smaller in size the plurality of through-holes, the more the effect of decreasing the viscosity is enhanced. The more the number of through-holes per unit area, the more the effect of decreasing the viscosity is enhanced. The viscosity is decreased probably because of the agitating action generated when the cream solder passes through the through-holes.

Projections 33e are formed at the inside of projecting portion 33b. The projections 33e are formed in positions so that the projections 33e are fitted into the through-holes 33d when the protruding portion 33b moves down.

As the side portion 33c, it is possible to use a flexible or elastic membrane such as a rubber membrane instead of the bellows-type membrane member 33c. Such elastic membrane is vertically flexible.

Cylinder 16 is vertically disposed above the cartridge 33. Pressure plate 32 is connected to rod 16a of the cylinder 16, and the pressure plate 32 is abutted on top of the projecting portion 33b. The cream solder 5 is stored in the volume-variable container 14 and is surrounded by the bellows-type membrane member 33c at the side thereof. When the cylinder 16 is driven, the pressure plate 32 is moved up and down in the volume-variable container 14. Since the cylinder 16 presses the projecting portion 33b downward via the pressure plate 32, the cream solder 5 in the cartridge 33 is pressurized and pushed out downward from the through-holes 33d. The cylinder 16 and the pressure plate 32 are paste pressurizing means to apply pressures to the paste.

Accordingly, the volume-variable container 14 comprising the push-out plate 33a, projecting portion 33b and bellows-type membrane member 33c is a container whose capacity can be varied with the pressures applied by the paste pressurizing means. As shown in FIG. 4(b), the projecting portion 33b is further moved down by the cylinder 16 until the projections 33e are fitted into the through-holes 33d. Thus, the cream solder 5 remaining in the volume-variable container 14 and the through-holes 33d is pushed by the projections 33e downward out of the volume-variable container 14. In this way, all the cream solder 5 contained in the volume-variable container 14 is completely pushed out without remaining in the volume-variable container 14 at all.

Also, when the cream solder 5 in the volume-variable container 14 is pushed by the pressure plate 32, the cream solder 5 is always inside the bellows-type membrane member 33c in the volume-variable container 14. Therefore, the cream solder 5 will never come into contact with any member outside the volume-variable container 14. Accordingly, when the cream solder 5 is pushed out by the pressure plate 32 moved up and down, it is not necessary to slide the contacting surface of the cream solder 5. As a result, there is no generation of defective operation due to change in property of the cream solder 5 and the resultant change in sliding motion of the cream solder 5.

Printing space 35 is formed under the volume-variable container 14. Two sheets of scraping portion 36A, 36B are disposed internally aslant under the volume-variable container 14, and there is provided a space opening at the lower side of the scraping portion 36A, 36B. The printing space 35 is a space surrounded by the underside of the volume-variable container, main body 30 and two sheets of scraping portion 36A, 36B. When the cream solder 5 is pushed out by the cylinder 16, the cream solder 5 passes through opening 33d in push-out plate 33a and then moves downward. Subsequently, the pushed out cream solder 5 goes into the printing space 35 formed under the volume-variable container 14.

The two sheets of scraping portion 36A, 36B form the front wall and rear wall of the printing space 35 in the direction of squeezing operation. With the squeegee head 13 shifted down, each bottom end of the scraping portions 36A, 36B is abutted on the surface of the mask plate 12. During the printing operation, the printing space 35 accommodates the pressurized cream solder 5, and then the cream solder 5 comes into contact with the mask plate 12.

When the cream solder 5 in the cartridge 33 is pressurized by the pressure plate 32, the cream solder 5 goes into the printing space 35 through the push-out plate 33a. In the course of moving of the cream solder 5, the cream solder 5 is forced by pressures to pass through a number of small through-holes 33d. In this way, the cream solder 5 is given a "kneading" motion. Such "kneading" motion causes the cream solder 5 to decrease in viscosity. As a result, the cream solder 5 is improved in property to become suitable for screen printing.

The squeegee head 13 having the viscosity-improved cream solder 5 filled in the printing space 35 is moved to slide on the mask plate 12. Thus, the paste in the printing space 35 is filled into the pattern hole 12a of mask plate 12 passing through the printing surface between the two sheets of scraping portion 36A, 36B.

When the squeegee head 13 is further moved, the cream solder 5 is sequentially filled into each pattern hole 12a. In this way, the cream solder 5 is filled into all the pattern holes 12a. After that, the substrate holding portion 2 moves downward. Then, the cream solder 5 filled in the pattern holes 12a is moved down together with the substrate 3 and is separated from the pattern holes 12a. Thus, screen printing of the cream solder 5 onto the substrate 3 is completed. In this way, the cream solder 5 is printed on the substrate 3.

In the printing operation described above, the cream solder 5 is reliably pushed out from the cartridge 33. Accordingly, the cream solder 5 may be supplied into the printing space 35 in good condition at all times. As a result, the cream solder 5 is filled in the pattern holes 12a with great accuracy. Further, since the cream solder 5 in the volume-variable container 14 is completely pushed out by the projecting portion 33b and is used up, it is possible to prevent generation of material wasting due to remaining of the cream solder 5 in the cartridge 33.

FIG. 5 shows a configuration of a cartridge used for screen printing in another embodiment of the present invention. In FIG. 5(a), elastic bag member 33g is disposed in the cartridge. Preferably, the elastic bag member 33g is an elastic membrane bag made of rubber material. Either end portion of the elastic bag member 33g is connected to the peripheral portion of the push-out plate 33a so that the through-hole 33d is covered with the elastic bag member 33g. Preferably, the capacity of the elastic bag member 33g is variable, and the projecting portion 33b is located above the bag member 33g. In this case, the pressure plate 32 presses the bag member 33g via the projecting portion 33b, see FIG. 5(b). Thus, the cream solder 5 remaining in the through-hole 33d is pushed out. With the projecting portion 33b shifted down to the lowering end, the projections 33e of the projecting portion 33b are fitted into the through-holes 33d via the bag member 33g. Then the cream solder 5 remaining in the through-holes 33d is pushed out. Since the cream solder 5 is completely pushed out by the projecting portion 33b and the bag member 33g and is used up, generation of material wasting due to remaining of the cream solder 5 in the cartridge 33 can be prevented. By such configuration, it is also possible to obtain same advantages as in the embodiment described earlier.

In the present exemplary embodiment, solder cream is used as the paste, but it is not limited to cream solder. Materials having fluidity may be used as the paste. For example, a conductive paste, electrically insulating paste, circuit pattern paste, coloring paste or the like may be used as the paste. After printing such paste on a substrate, the printed paste is dried or hardened.

In the present exemplary embodiment, there is no limitations on the substrate used. For example, substrates used for wiring circuit boards, substrate used for printed boards, or electrically insulating substrates used for electronic parts are employed.

As described above, by the configuration of the present invention, the paste being stable in viscosity is pushed out into the printing space. In addition, all the paste stored in the paste storage container is pushed out into the printing space without remaining in the paste storage container. Thus, the generation of material wasting due to remaining of the paste in the cartridge can be prevented. The paste is pushed out into the printing space in good condition at all times. As a result, the paste is filled in the pattern holes of the mask plate with great accuracy.

What is claimed is:

1. A screen printing apparatus to print a paste on a substrate, comprising:
   (a) a positioning section which holds said substrate;
   (b) a mask plate having pattern holes, said mask plate being disposed above said substrate;
   (c) a squeegee head to store the paste and supply the paste onto said mask plate; and (d) a pressure mechanism to pressurize the paste in said squeegee head,
  wherein said squeegee head includes a paste storage container to store the paste and a printing space to accommodate the paste supplied from said paste storage container;
  said paste storage container has a volume-variable container which varies in volume according to an operation of said pressure mechanism;
  said volume-variable container has a plurality of through-holes, a push-out plate which forms the bottom of said volume-variable container, and a free-to-move projecting portion,
  said volume-variable container is reduced in volume according to the operation of said pressure mechanism, and the paste filled in said volume-variable container is pushed out into said printing space through said through-holes, and thereby, the paste is supplied onto said mask plate,
  said plurality of through-holes are formed at said push-out plate,
  the paste is pushed out into said printing space through said plurality of through-holes, and
  said projecting portion has a plurality of projections which may fit into said plurality of through-holes, and according to the operation of said pressure mechanism, said projecting portion moves to push out the paste in said volume-variable container into said printing space through said plurality of through-holes, and then said projections fit into said plurality of through-holes to push out the paste remaining in said plurality of through-holes into said printing space,
  wherein said volume-variable container further includes a side wall member that forms the side wall of said volume-variable container, said side wall member being flexible, and
  said projecting portion moves downward while compressing said side wall member.

2. The screen printing apparatus of claim 1, wherein said plurality of through-holes are shaped so that the paste is decreased in viscosity while passing through said plurality of through-holes.

3. The screen printing apparatus of claim 1, further comprising:
  a main body to retain said paste storage container,
  wherein said paste storage container is removably disposed in said main body.

4. The screen printing apparatus of claim 1, wherein said pressure mechanism includes a pressure plate, and
  said pressure plate is abutted on top of said projecting portion.

5. The screen printing apparatus of claim 1, wherein said squeegee head has two sheets of scraping portions,
  said printing space is surrounded by said push-out plate and said two scraping portions, and
  said two scraping portions are arranged in a manner such that said printing space is internally sloped so as to be downwardly reduced in sectional area, thus forming an opening at the bottom thereof.

6. The screen printing apparatus of claim 1, wherein said squeegee head is disposed in a manner such that said squeegee head moves to slide on said mask plate.

7. A screen printing apparatus to print a paste on a substrate, comprising:
(a) a positioning section which holds said substrate;
(b) a mask plate having pattern holes, said mask plate being disposed above said substrate;
(c) a squeegee head to store the paste and supply the paste onto said mask plate; and
(d) a pressure mechanism to pressurize the paste in said squeegee head,
  wherein said squeegee head includes a paste storage container to store the paste and a printing space to accommodate the paste supplied from said paste storage container;
  said paste storage container has a volume-variable container which varies in volume according to an operation of said pressure mechanism;
  said volume-variable container has a plurality of through-holes, a push-out plate which forms the bottom of said volume-variable container and a free-to-move projecting portion,
  said volume-variable container is reduced in volume according to the operation of said pressure mechanism, and the paste filled in said volume-variable container is pushed out into said printing space through said through-holes, and thereby, the paste is supplied onto said mask plate,
  said plurality of through-holes are formed at said push-out plate,
  the paste is pushed out into said printing space through said plurality of through-holes, and
  said projecting portion has a plurality of projections which may fit into said plurality of through-holes, and according to the operation of said pressure mechanism, said projecting portion moves to push out the paste in said volume-variable container into said printing space through said plurality of through-holes, and then said projections fit into said plurality of through-holes to push out the paste remaining in said plurality of through-holes into said printing space,
  wherein said volume-variable container further includes an elastic bag member having an opening;
  said push-out plate is located at the opening;
  said elastic bag member is flexible; and
  with the paste filled into said elastic bag member, when said projecting portion moves downward while compressing said elastic bag member, the paste in said elastic bag member is pushed out into said printing space through said plurality of through-holes, and then said projections fit into said plurality of through-holes via said elastic bag member.

8. A screen printing method comprising the steps of:
(a) preparing a squeegee head having a volume-variable container and a printing space,
  where said volume-variable container includes a projecting portion with projections, side wall, and push-out plate with through-holes, and
  said printing space is communicated to said push-out plate;
(b) storing a paste in said volume-variable container;
(c) pressurizing said projecting portion and also pushing out the paste into said printing space through said through-holes while compressing the interior of said volume-variable container;
(d) continuously pressurizing said projecting portion so that said projections fit into said through-holes, thereby pushing out the paste remaining in said through-holes into said printing space;

(e) supplying the paste pushed out into said printing space onto a mask plate to print the paste on a substrate via said mask plate, wherein said side wall has a flexible side wall member; said projecting portion moves downward while compressing said side wall member; and thereby, the paste stored in said volume-variable container is pushed out into said printing space.

9. The screen printing method of claim 8, wherein said projecting portion forms a top of said volume-variable container;

said push-out plate forms a bottom of said volume-variable container;

said printing space is arranged under said volume-variable container;

when said projecting portion moves downward, the paste stored in said volume-variable container is pushed out into said printing space arranged under said push-out plate; and the paste pushed out into said printing space is supplied onto said mask plate located at the underside of said printing space.

10. The screen printing method of claim 8, wherein said squeegee head moves to slide on said mask plate.

11. The screen printing method of claim 8, wherein while the paste passes through the through-holes, the paste is decreased in viscosity, and the paste decreased in viscosity is pushed out into said printing space.

12. The screen printing method of claim 8, wherein when said projecting portion is pressurized, said projections are respectively fitted into said through-holes, and thereby, the paste remaining in each through-hole is pushed out into said printing space.

13. The screen printing method of claim 8, wherein the paste is pushed out of an opening formed at an underside of said printing space onto said mask plate.

14. A screen printing method comprising the steps of:

(a) preparing a squeegee head having a volume-variable container and a printing space, where said volume-variable container includes a projecting portion with projections, side wall, and push-out plate with through-holes, and said printing space is communicated to said push-out plate;

(b) storing a paste in said volume-variable container;

(c) pressurizing said projecting portion and also pushing out the paste into said printing space through said through-holes while compressing the interior of said volume-variable container;

(d) continuously pressurizing said projecting portion so that said projections fit into said through-holes, thereby pushing out the paste remaining in said through-holes into said printing space;

(e) supplying the paste pushed out into said printing space onto a mask plate to print the paste on a substrate via said mask plate, wherein said volume-variable container further includes an elastic bag member having an opening; said push-out plate is located at the opening;

said elastic bag member is flexible;

the paste is filled into said elastic bag member;

when said projecting portion moves downward while compressing said elastic bag member, the paste in said elastic bag member is pushed out into said printing space through said through-holes, and then said projections are fitted into the through-holes via said elastic bag member; and said elastic bag member pushes out the paste remaining in said through-holes.

15. A paste storage container used for a screen printing apparatus to print a paste on a substrate, comprising:

a projecting portion;

a push-out plate disposed in a position opposing to said projecting portion; and a side wall disposed between said projecting portion and said push-out plate, wherein a volume-variable container is formed by said projecting portion, said push-out plate, and said side wall;

the paste is stored in said volume-variable container;

said projecting portion has a plurality of projections;

said push-out plate has a plurality of through-holes, and each of said projections is thrust into each of the through-holes respectively, said projecting portion is able to move toward said push-out plate; and when said projecting portion moves toward said push-out plate, the paste stored in said volume-variable container is pushed out through said through-holes, and then said projections are thrust into said through-holes, wherein said side wall has a flexible side member, and said projecting portion moves while pushing said side member.

16. The paste storage container of claim 15, wherein said projections are shaped so as to be able to fit into said through-holes;

when said projecting portion is moved, said projection is fitted into said through-holes; and said projections push out the paste remaining in said through-holes.

17. A paste storage container used for a screen printing apparatus to print a paste on a substrate, comprising:

a projecting portion;

a push-out plate disposed in a position opposing to said projecting portion; and a side wall disposed between said projecting portion and said push-out plate, wherein a volume-variable container is formed by said projecting portion, said push-out plate, and said side wall;

the paste is stored in said volume-variable container;

said projecting portion has a plurality of projections;

said push-out plate has a plurality of through-holes and each of said projections is thrust into each of the through-holes respectively, said projecting portion is able to move toward said push-out plate; and when said projecting portion moves toward said push-out plate, the paste stored in said volume-variable container is pushed out through said through-holes, and then said projections are thrust into said through-holes, wherein said side wall includes an elastic bag member having an opening;

said push-out plate is located at the opening;

said elastic bag member is flexible;

the paste is filled into said elastic bag member; and when said projecting portion moves while compressing said elastic bag member, the paste in said elastic bag member is pushed out into said printing space through said through-holes, and then said projections are thrust into said through-holes via said elastic bag member, and said elastic bag member pushes out the paste remaining in said through-holes.

* * * * *